US010440833B2

(12) United States Patent
Toda et al.

(10) Patent No.: US 10,440,833 B2
(45) Date of Patent: Oct. 8, 2019

(54) PRODUCTION METHOD OF ELECTRONIC COMPONENT BOARD WITH UNCUT PORTIONS FOR HEAT RADIATING PORTIONS

(71) Applicant: Yazaki Corporation, Tokyo (JP)

(72) Inventors: Takafumi Toda, Kosai (JP); Takeyuki Hamaguchi, Kosai (JP)

(73) Assignee: Yazaki Corporation, Tokyo (JP)

( * ) Notice: Subject to any disclaimer, the term of this patent is extended or adjusted under 35 U.S.C. 154(b) by 174 days.

(21) Appl. No.: 15/381,380

(22) Filed: Dec. 16, 2016

(65) Prior Publication Data
US 2017/0150612 A1 May 25, 2017

Related U.S. Application Data

(62) Division of application No. 13/792,467, filed on Mar. 11, 2013, now abandoned.

(30) Foreign Application Priority Data

Mar. 12, 2012 (JP) ................................. 2012-054226

(51) Int. Cl.
*H05K 3/20* (2006.01)
*H05K 1/02* (2006.01)
(Continued)

(52) U.S. Cl.
CPC ............ *H05K 3/20* (2013.01); *H05K 1/0203* (2013.01); *H05K 1/0209* (2013.01);
(Continued)

(58) Field of Classification Search
CPC .... H05K 13/04; H05K 1/0203; H05K 1/0209; H05K 1/0212; H05K 1/0263; H05K 2201/09781; H05K 2201/10272
See application file for complete search history.

(56) References Cited

U.S. PATENT DOCUMENTS 4,303,297 A * 12/1981 Smart ................... H01R 43/24
439/650
4,659,167 A * 4/1987 Masuda ................. H01H 11/00
439/668
(Continued)

FOREIGN PATENT DOCUMENTS

EP 0802711 A2 10/1997
JP H09289360 A 11/1997
(Continued)

OTHER PUBLICATIONS

Notification of Reasons for Refusal, issued in corresponding Japanese Patent Application No. JP 2012-054226, dated Nov. 24, 2015.
(Continued)

*Primary Examiner* — Minh N Trinh
(74) *Attorney, Agent, or Firm* — Locke Lord LLP

(57) ABSTRACT

An electronic component board is produced by die-cutting a metal plate in a lump into the bus bars and a band-shaped connecting portion connected to the bus bars, having a constant width, and positioned at an outer edge of the metal plate, by attaching the bus bars to the insulating plate, and by cutting and removing the connecting portion while leaving a part of the connecting portion uncut which is used as the heat radiating portion. Additional steps of the method include providing the metal plate, the insulation plate, and an electrical component, and electrically connecting the electrical component to the plurality of bus bars.

2 Claims, 4 Drawing Sheets

(51) Int. Cl.
  *H05K 13/04* (2006.01)
  *H05K 3/00* (2006.01)
(52) U.S. Cl.
  CPC ......... *H05K 1/0212* (2013.01); *H05K 1/0263* (2013.01); *H05K 3/0044* (2013.01); *H05K 13/04* (2013.01); *H05K 3/202* (2013.01); *H05K 2201/09781* (2013.01); *H05K 2201/10272* (2013.01); *H05K 2203/0228* (2013.01); *Y10T 29/4913* (2015.01)

(56) References Cited

U.S. PATENT DOCUMENTS

| | | | | |
|---|---|---|---|---|
| 4,783,906 | A * | 11/1988 | Gingerich | H02K 5/148 29/827 |
| 4,895,536 | A * | 1/1990 | Gingerich | H02K 5/148 264/272.14 |
| 5,184,283 | A | 2/1993 | Hamel | |
| 6,493,234 | B2 | 12/2002 | Sunami et al. | |
| 7,167,377 | B2 * | 1/2007 | Onizuka | H05K 1/0263 361/772 |
| 7,203,073 | B2 * | 4/2007 | Kawakita | H05K 1/0263 361/775 |
| 7,207,847 | B2 | 4/2007 | Nagai et al. | |
| 7,332,673 | B2 | 2/2008 | Shimoda et al. | |
| 7,414,194 | B2 | 8/2008 | Nakayama et al. | |
| 8,416,575 | B2 * | 4/2013 | Sato | H01R 9/226 174/260 |
| 2001/0012708 | A1 | 8/2001 | Mizuno et al. | |
| 2004/0190272 | A1 * | 9/2004 | Takagi | H05K 3/202 361/775 |
| 2013/0235531 | A1 * | 9/2013 | Toda | H05K 1/0209 361/720 |

FOREIGN PATENT DOCUMENTS

| | | |
|---|---|---|
| JP | 2001211529 A | 8/2001 |
| JP | 2011192905 A | 9/2011 |
| WO | WO-2012014491 A1 | 2/2012 |

OTHER PUBLICATIONS

Notification of Reasons for Refusal, issued in corresponding Japanese Patent Application No. JP 2012-054226, dated Feb. 23, 2016.

* cited by examiner

PRODUCTION METHOD OF ELECTRONIC COMPONENT BOARD WITH UNCUT PORTIONS FOR HEAT RADIATING PORTIONS

CROSS REFERENCE TO RELATED APPLICATIONS

This application is on the basis of Japanese Patent Application No. 2012-054226, the contents of which are hereby incorporated by reference.

TECHNICAL FIELD

The present invention relates to an electronic component board made by attaching a plurality of bus bars to an insulating board, and having a heat radiating portion for radiating heat of the bus bars, and relates to a production method of the electronic component board.

BACKGROUND ART

An electrical junction box mounted on a vehicle has various structures. For example, the electrical junction box disclosed in PTL 1 includes: an insulating case; and an electronic component board received in an inside of the insulating case. The electronic component board includes: an insulating plate; a plurality of bus bars attached to the insulating plate; electronic components electrically connected to the bus bars; and a heat radiating member for radiating heat of the bus bars. The heat radiating member is separated from the bus bars, and abuts on the bus bars via an insulating sheet.

One example of a production method of the above electronic component board will be explained with reference to FIG. 4. FIG. 4 is a perspective view showing a conventional chained bus bar body 210 made by punching a metal plate to form a plurality of bus bars 2 and a connecting portion 6 connected to the plurality of bus bars 2. When producing the electronic component board, firstly, the chained bus bar body 210 shown in FIG. 4 is punched out from a metal plate, and the plurality of bus bars 2 connected to the connecting portion 6 is attached to the insulating plate. Then, gate portions 7 of the chained bus bar body 210 are cut along a cut line C in FIG. 4 to remove the connecting portion 6. Then, when various electronic components and heat radiating members are attached, the electronic component board is completed.

CITATION LIST

Patent Literature

PTL 1: JP, A, 2001-211529

SUMMARY OF INVENTION

Technical Problem

However, in the above electronic component board, the bus bar is separated from the heat radiating member, and it is necessary to hold the insulating sheet between the bus bar and the heat radiating member. Therefore, there is a problem that the number of parts of the electronic component board is increased, and manpower for producing the electronic component board is increased. Further, instead of providing the heat radiation member, there is an electronic component board in which the heat radiating performance of the bus bar is increased by increasing a size of the bus bar. However, when the size of the bus bar is simply increased, there is a problem that the cost of the electronic component board may be increased, and the electronic component board may be large-sized.

Accordingly, an object of the present invention is to provide an electronic component board which is easily produced, and able to radiate the heat of the bus bar excellently without increasing the size of the bus bar and increasing the number of parts, and to provide a production method of the electronic component board.

Solution to Problem

For achieving the object, according to a first aspect of the present invention, there is provided an electronic component board including:

an insulating plate;
a plurality of bus bars attached to the insulating plate; and
electronic components electrically connected to the bus bars, wherein a plurality of heat radiating portions are integrally formed with any of the bus bars, and provided along an outer periphery of the insulating plate, and wherein a width of each heat radiating portion extended parallel to the outer periphery of the insulating plate is constant.

According to a second aspect of the present invention, there is provided the electronic component board as described in the first aspect, wherein the bus bar integrally formed with the heat radiating portion includes: a component mount portion on which the electronic component is mounted; a terminal portion to which an external terminal is connected; and an intermediate portion positioned between the component mount portion and the terminal portion, and wherein the width of each heat radiating portion extended parallel to the outer periphery of the insulating plate is wider than a width of the intermediate portion.

According to a third aspect of the present invention, there is provided the electronic component board as described in the first or second aspect, wherein the heat radiating portion is extended vertically in a thickness direction of the insulating plate.

According to a fourth aspect of the present invention, there is provided a production method of the electronic component board as described in any one of the first to third aspect, said method comprising the steps of:

die-cutting a metal plate in a lump into a plurality of bus bars and a band-shaped connecting portion connected to the bus bars, having a constant width, and positioned at an outer edge of the metal plate;

attaching the bus bars connected to the connecting portion to an insulating board; and then cutting and removing the connecting portion while leaving a part of the connecting portion uncut which is used as a heat radiating portion.

Advantageous Effects of Invention

According to the inventions described in the first and second aspects, a plurality of heat radiating portions are integrally formed with any of the bus bars and provided along an outer periphery of the insulating plate, and a width of each heat radiating portion extended parallel to the outer periphery of the insulating plate is constant. Therefore, an electronic component board can be provided which is easily produced, and able to radiate the heat of the bus bar excellently without increasing the size of the bus bar and increasing the number of parts.

According to the inventions described in the third aspect, because the heat radiating portion is extended vertically in a thickness direction of the insulating plate, the electronic component hoard is prevented from being large-sized.

According to the inventions described in the fourth aspect, the production method including the steps of: die-cutting a metal plate in a lump into a plurality of bus bars and a band-shaped connecting portion connected to the bus bars, having a constant width, and positioned at an outer edge of the metal plate; attaching the bus bars connected to the connecting portion to an insulating board; and then cutting and removing the connecting portion while leaving a part of the connecting portion uncut which is used as a heat radiating portion. Therefore, the connecting portion which is conventionally discarded is effectively used, and the cost of the electronic component board is reduced.

These and other objects, features, and advantages of the present invention will become more apparent upon reading of the following detailed description along with the accompanied drawings.

DESCRIPTION OF EMBODIMENTS

An electronic component board and a production method of the electronic component board according to an embodiment of the present invention will be explained with reference to FIGS. 1 to 3.

Figure 1:
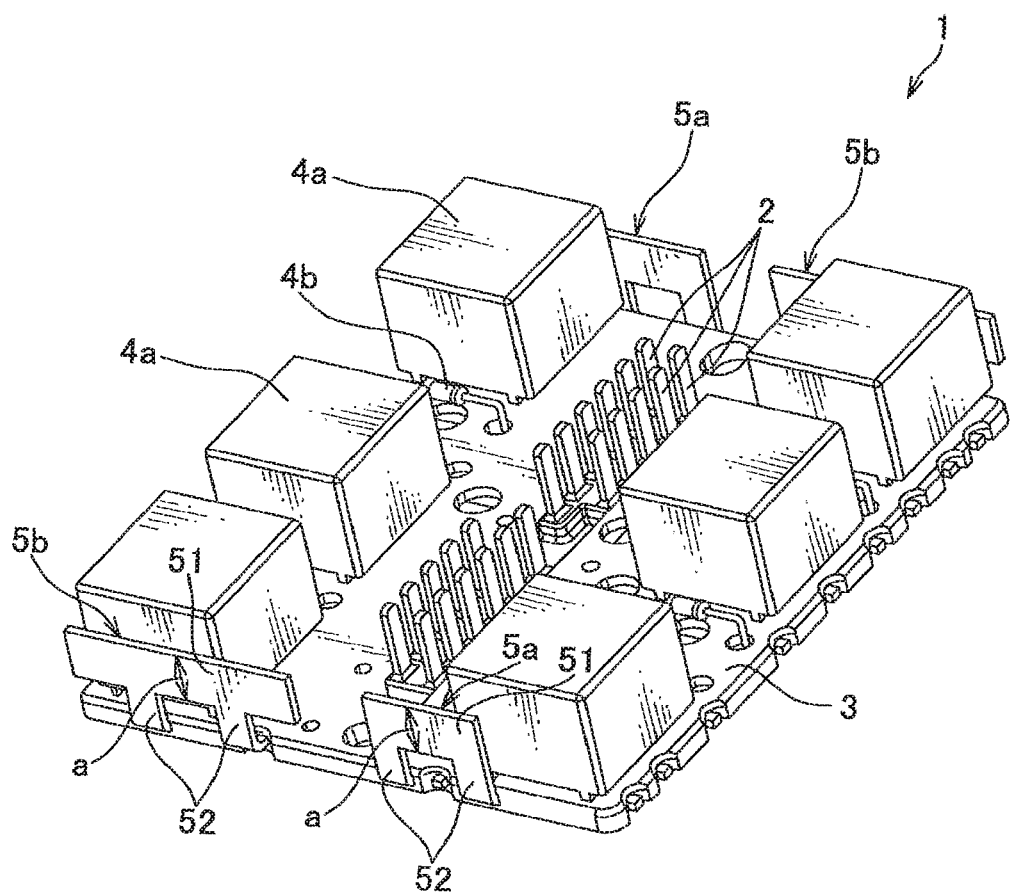
FIG. 1 is a perspective view showing an electronic component board according to an embodiment of the present invention.

An electronic component board 1 of the present invention shown in FIG. 1 is used in an on-vehicle electrical junction box. In this electronic component board 1, a plurality of bus bars 2 is attached to an insulating plate 3, and electronic components 4a, 4b are electrically connected to the bus bars 2. Incidentally, reference sign 4a denotes a relay, and reference sign 4b denotes a resistor. Further, in the electronic component board 1, a plurality of heat radiating portions 5a, 5b integrally formed with specific bus bars 2 are provided, along an outer periphery of the insulating plate 3.

Figure 2:
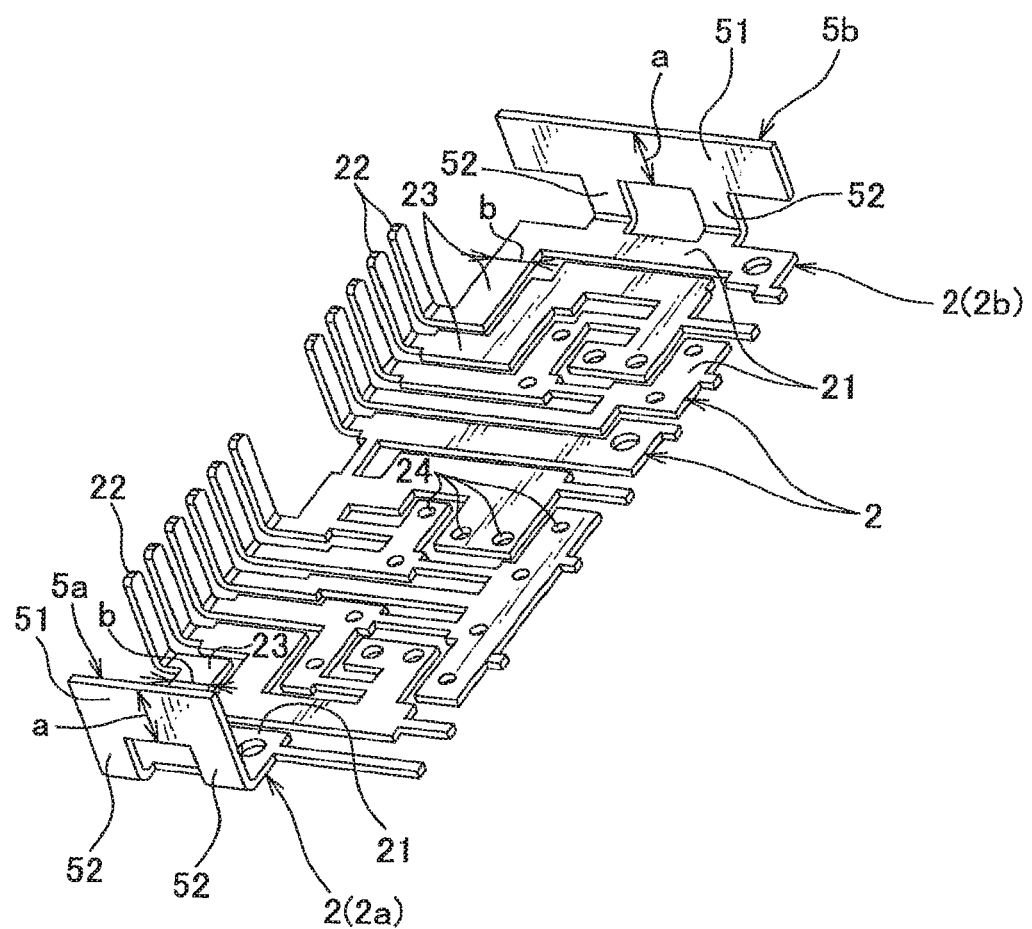
FIG. 2 is a perspective view showing a plurality of bus bars composing the electronic component board shown in FIG. 1.

As shown in FIG. 2, the bus bars 2 includes: a component mount portion 21 on which the electronic components 4a, 4b are mounted; a terminal portion 22 to which an external terminal is connected; and an intermediate portion 23 positioned between the component mount portion 21 and the terminal portion 22. The component mount portion 21 and the intermediate portion 23 are flat, and arranged on the same plane. Through-holes 24 into which lead portions of the electronic components 4a, 4b are inserted are provided on the component mount portion 21. The terminal portion 22 is bent at a right angle in an end of the intermediate portion 23.

Further, reference sign 2a is used for the bus bar 2 integrally formed with the heat radiating portion 5a out of the bus bars 2 for differentiating from the other bus bars 2. Similarly, reference sign 2b is used for the bus bar 2 integrally formed with the heat radiating portion 5b. Further, in the present invention, the term "integrally formed" means to die-cut at the same time from one metal plate, and an integral formation by adhering or welding is not included.

The heat radiating portions 5a, 5b are intended for radiating the heat of the bus bars 2a, 2b. As shown in FIGS. 1 and 2, each of the heat radiating portions 5a, 5b includes: a pair of portions 52 (later-described gate portions) extended from an edge of the component mount portion 21 side of the bus bars 2a, 2b; and a portion 51 crossing the pair of portions 52, and extended parallel to the outer periphery of the insulating plate 3.

Further, a width "a" of the portion 51 extended parallel to the outer periphery of the insulating plate 3 in the heat radiating portion 5a and a width "a" of the portion 51 extended parallel to the outer periphery of the insulating plate 3 in the heat radiating portion 5b are constant, namely, the same. Further, the width "a" of the portion 51 extended parallel to the outer periphery of the insulating plate 3 in the heat radiating portions 5a, 5b is wider than a width "b" of the intermediate portion 23 of the bus bars 2a, 2b integrally formed with the heat radiating portions 5a, 5b. Further, the width "a" of the portion 51 extended parallel to the outer periphery of the insulating plate 3 according to the present invention is more than 10 millimeters.

The heat radiating portions 5a, 5b are bent at a right angle at edges of the component mount portion 21 of the bus bars 2a, 2b, and extended vertically in a thickness direction of the insulating plate 3.

Because the heat radiating portions 5a, 5b are integrally formed with the bus bars 2a, 2b, the electronic component board 1 can be easily produced without increasing the sizes of the bus bars 2a, 2b and increasing the number of parts. Further, because the plurality of heat radiating portions 5a, 5b are provided along the outer periphery of the insulating plate 3, the electronic component board 1 can radiate the heat of the bus bars 2a, 2b excellently. Further, because the heat radiating portions 5a, 5b are extended vertically in a thickness direction of the insulating plate 3, the electronic component board 1 is prevented from being large-sized.

Next, a production method of the electronic component board 1 will be explained. When producing the electronic component board 1, firstly, a chained bus bar body 10 shown in FIG. 3 is die-cut from a sheet of rectangular metal plate. The chained bus bar body 10 is attained by die-cutting the metal plate in a lump into the plurality of bus bars 2 (including the bus bars 2a, 2b), a connecting portion positioned at an outer edge of the metal plate, and a gate portions 7, 52 connecting the bus bars 2 with the connecting portion 6. The connecting portion 6 is formed totally in a U-shape by a band-shaped long side portion 6a having a constant; width, and band-shaped short side portions 6b having a constant width and continued to both ends of the long side portion 6a. A width of the long side portion 6a and a width of the short side portion 6b are the same. Further, a plurality of guide holes 60 is provided on the long side portion 6a. The gate portions 7 are continued to the long side portion 6a. The gate portions 52 connect the bus bars 2a, 2b integrally formed with the heat radiating portions 5a, 5b with the short side portion 6b. Because these gate portions 52 are components of the heat radiating portions 5a, 5b, a width of the gate portion 52 is formed wider than a width of the gate portion 7.

Next, the plurality of bus bars 2 connected to the connecting portion 6 of the chained bus bar body 10 is attached to the insulating plate 3. In the electronic component board 1 of the present invention, when the chained bus bar body 10 is set in a molding die of the insulating plate 3, and insert-molded, the plurality of bus bars 2 is attached to the insulating plate 3. Further, the electronic component board 1 of this embodiment is made by arranging two chained bus bar bodies 10 point-symmetrically and by insert-molding the chained bus bar bodies 10. Further, according to the present invention, the bus bars 2 may be attached to the insulating plate 3 by locking the bus bars 2 with the insulating plate 3.

Figure 3:
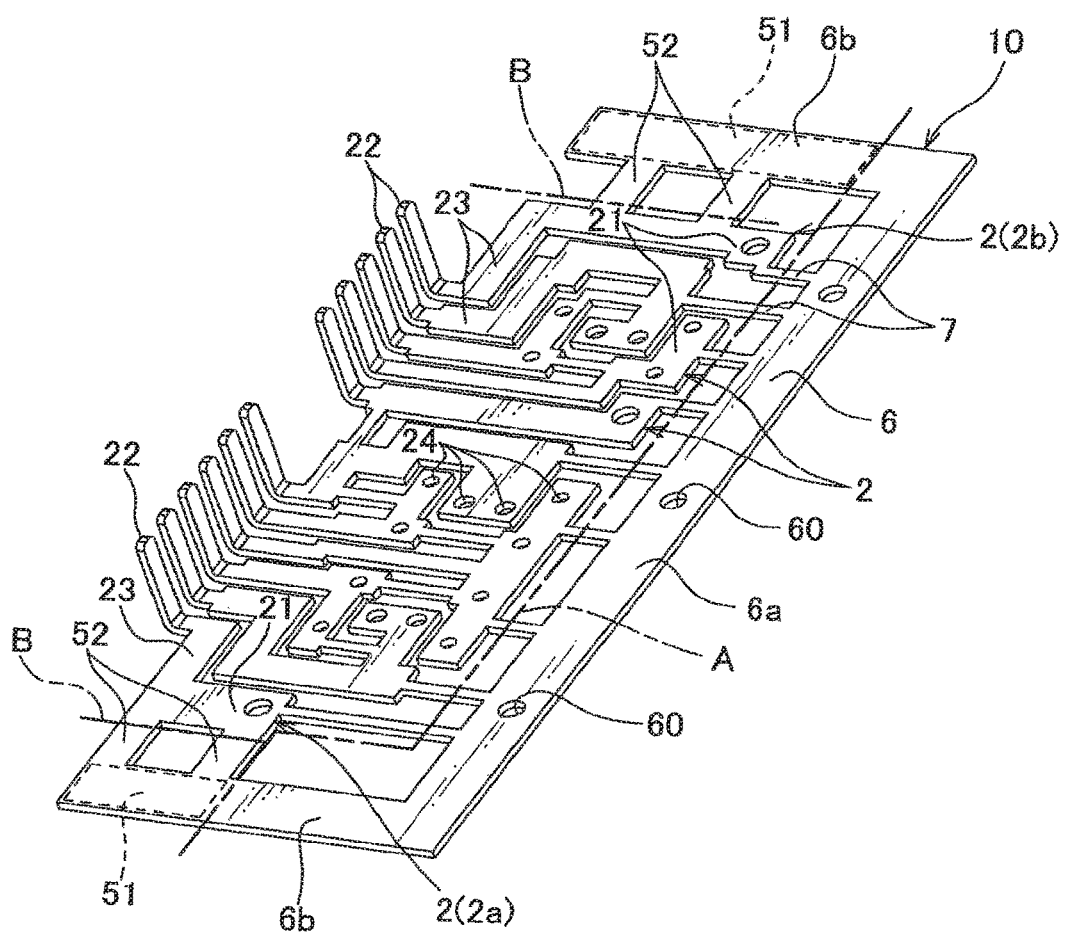
FIG. 3 is a perspective view showing a chained bus bar body made by die-cutting a metal plate in a lump into the plurality of bus bars shown in FIG. 2 and a connecting portion connected to the bus bars.
Figure 4:
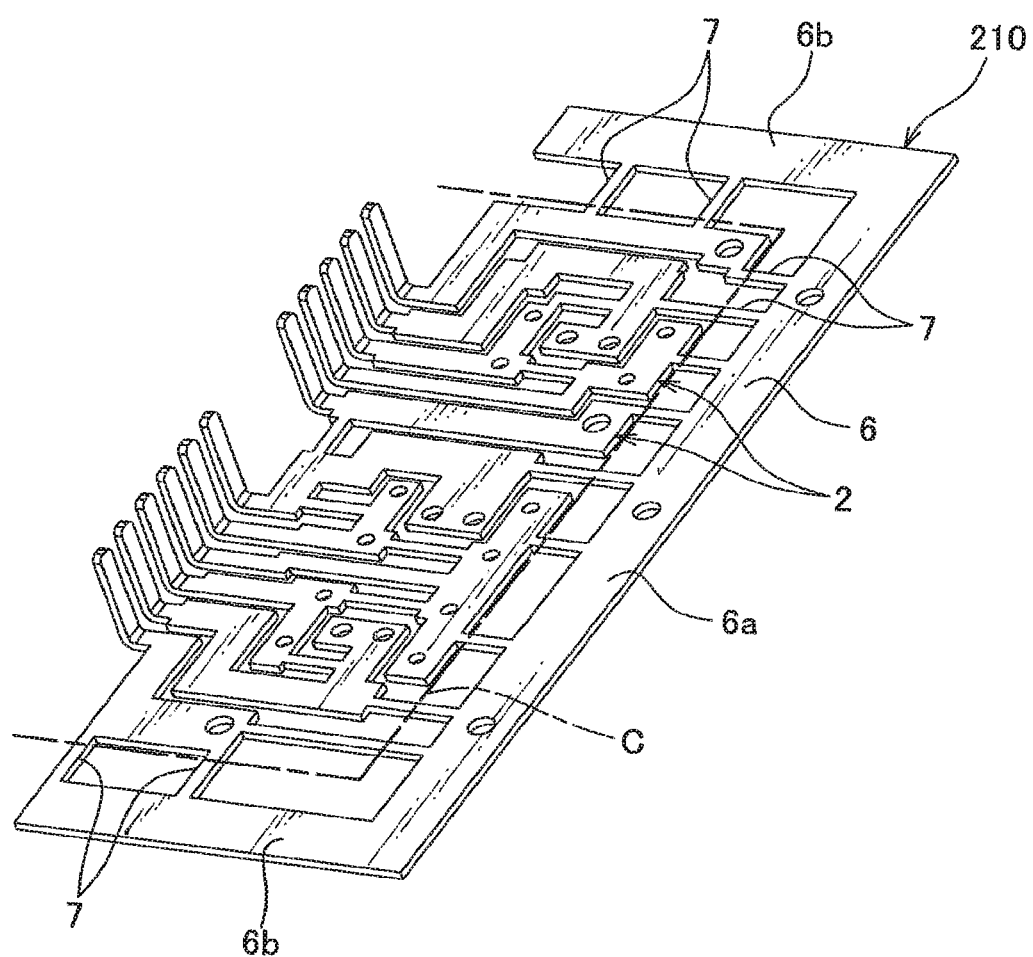
FIG. 4 is a perspective view showing a conventional chained bus bar body made by die-cutting a metal plate in a lump into a plurality of bus bars and a connecting portion connected to the bus bars.

Next, the gate portion 7 and the short side portion 6b are cut along a cut line "A" in FIG. 3, and removed while the connecting portion 6 is partially left (a portion 51 surrounded by a dotted line in FIG. 3). Namely, the gate portion 7 and the short side portion 6b are removed except the portions to be the heat radiating portions 5a, 5b. Then, when the component mount portion 21 side edges of the bus bars 2a, 2b are folded along a folding line "B" in FIG. 3, the heat radiating portions 5a, 5b are made from a part of the gate portions 52 and the connecting portion 6. Then, when a plurality of electronic components 4a, 4b is soldered to the plurality of bus bars 2, the electronic component board 1 is completed.

According to the above production method, the connecting portion 6 which is conventionally discarded is effectively used, and the cost of the electronic component board 1 can be reduced.

The invention has been described in connection with what are presently considered to be the most practical and preferred embodiments. However, the present invention has been presented by way of illustration and is not intended to be limited to the disclosed embodiments. Accordingly, those skilled in the art will realize that the invention is intended to encompass all modifications and alternative arrangements included within the spirit and scope of the invention, as set forth by the appended claims.

REFERENCE SIGNS LIST

1 electronic component board
2 bus bar
3 insulating plate
4a, 4b electronic component
5a, 5b heat radiating portion
6 connecting portion
21 component mount portion
22 terminal portion
23 intermediate portion
51 portion extended parallel to the outer periphery of the insulating plate

What is claimed is:

1. A production method of an electronic component board comprising the steps of:
    providing a metal plate, an insulation plate, and an electrical component;
    die-cutting the metal plate into a plurality of bus bars and a band-shaped connecting portion connected to the plurality of bus bars, having a constant width, and positioned at an outer edge of the metal plate;
    attaching the plurality of bus bars connected to the band shaped connecting portion to an insulating plate;
    while leaving a part of the band shaped connecting portion uncut, cutting a remaining of the band shaped connecting portion;
    forming a heat radiating portion from bending the uncut portion of the connecting portion; and
    electrically connecting the electrical component to the plurality of bus bars to produce the electronic component board.

2. The production method according to claim 1, wherein the plurality of bus bars including a component mount portion on which the electronic component is mounted; a terminal portion to which an external terminal is connected; an intermediate portion positioned between the component mount portion and the terminal portion, and a plurality of heat radiating portions different from the terminal portion, and provided along an outer periphery of the insulating plate.

* * * * *